US 9,293,611 B1

(12) United States Patent
Hwang et al.

(10) Patent No.: US 9,293,611 B1
(45) Date of Patent: Mar. 22, 2016

(54) SOLAR CELL STRUCTURE AND METHOD FOR FABRICATING THE SAME

(71) Applicant: Huey-Liang Hwang, Hsinchu (TW)

(72) Inventors: Huey-Liang Hwang, Hsinchu (TW); Jian-Yang Lin, Douliu (TW); Cheng-Siang Hu, Douliu (TW); Chao-Chang Li, Douliu (TW)

(73) Assignee: Huey-Liang Hwang, Hsinchu (TW)

( * ) Notice: Subject to any disclaimer, the term of this patent is extended or adjusted under 35 U.S.C. 154(b) by 0 days.

(21) Appl. No.: 14/495,048

(22) Filed: Sep. 24, 2014

(51) Int. Cl.
*H01L 31/0216* (2014.01)
*H01L 31/18* (2006.01)
*H01L 31/0236* (2006.01)

(52) U.S. Cl.
CPC .... *H01L 31/02168* (2013.01); *H01L 31/02167* (2013.01); *H01L 31/02366* (2013.01); *H01L 31/1804* (2013.01)

(58) Field of Classification Search
CPC .............. H01L 31/02168; H01L 31/02167; H01L 31/02366; H01L 31/1804; H01L 31/052; H01L 31/18
USPC ................ 438/72; 136/256, 291, 293, 259
See application file for complete search history.

(56) References Cited

U.S. PATENT DOCUMENTS

| | | | | |
|---|---|---|---|---|
| 4,321,099 A * | 3/1982 | Frosch et al. | | 438/89 |
| 5,681,402 A * | 10/1997 | Ichinose et al. | | 136/256 |
| 6,437,234 B1 * | 8/2002 | Kyoda et al. | | 136/250 |
| 6,653,552 B2 * | 11/2003 | Sugawara et al. | | 136/250 |
| 8,262,382 B2 * | 9/2012 | Taguchi et al. | | 425/385 |
| 8,658,885 B2 * | 2/2014 | Kikuchi et al. | | 136/249 |
| 8,809,097 B1 * | 8/2014 | Ravi et al. | | 438/57 |
| 2003/0005956 A1 * | 1/2003 | Hirata et al. | | 136/256 |
| 2003/0121544 A1 * | 7/2003 | Hirata et al. | | 136/256 |
| 2004/0043210 A1 * | 3/2004 | Seto et al. | | 428/331 |
| 2008/0295887 A1 * | 12/2008 | Moslehi | | 136/259 |
| 2011/0073162 A1 * | 3/2011 | Kikuchi et al. | | 136/246 |
| 2012/0091490 A1 * | 4/2012 | Fujikane et al. | | 257/98 |
| 2012/0097229 A1 * | 4/2012 | Aoki | | 136/255 |
| 2012/0103406 A1 * | 5/2012 | Kayes et al. | | 136/256 |
| 2012/0104460 A1 * | 5/2012 | Nie et al. | | 257/184 |
| 2012/0153254 A1 * | 6/2012 | Mastro | | 257/13 |
| 2012/0171805 A1 * | 7/2012 | Hu et al. | | 438/72 |
| 2012/0199184 A1 * | 8/2012 | Nie et al. | | 136/255 |
| 2012/0211725 A1 * | 8/2012 | Yokogawa et al. | | 257/13 |
| 2012/0260979 A1 * | 10/2012 | Lee et al. | | 136/256 |
| 2012/0279566 A1 * | 11/2012 | Bruder et al. | | 136/257 |

(Continued)

*Primary Examiner* — Caleb Henry
(74) *Attorney, Agent, or Firm* — Muncy, Geissler, Olds & Lowe, P.C.

(57) ABSTRACT

A solar cell structure with a microsphere-roughened antireflection structure comprises a P-type metal contact electrode, a P-type semiconductor layer, a P-type monocrystalline substrate, an N-type semiconductor layer, an N-type metal contact electrode, and a microsphere-roughened antireflection layer. The N-type semiconductor layer and the P-type semiconductor layer are respectively arranged on an upper surface and a lower surface of the P-type monocrystalline substrate. The P-type metal contact electrode is arranged below the P-type semiconductor layer. The N-type metal contact electrode has a specified pattern and is connected with the N-type semiconductor layer. The microsphere-roughened antireflection layer is arranged on an upper surface of the N-type semiconductor layer without covering the N-type metal contact electrode. The microsphere-roughened antireflection layer reduces the reflection of sunlight and increases the transmittance of sunlight to enhance the efficiency of solar cells.

7 Claims, 3 Drawing Sheets

(56) References Cited

U.S. PATENT DOCUMENTS

| | | | |
|---|---|---|---|
| 2012/0305059 A1* | 12/2012 | Kayes et al. | 136/255 |
| 2013/0081694 A1* | 4/2013 | Nakayama et al. | 136/258 |
| 2013/0092219 A1* | 4/2013 | Tsutsumi et al. | 136/255 |
| 2013/0153027 A1* | 6/2013 | Youngbull et al. | 136/257 |
| 2013/0207090 A1* | 8/2013 | Walba | 257/40 |
| 2014/0137934 A1* | 5/2014 | Geerligs | 136/256 |
| 2014/0159187 A1* | 6/2014 | Lin et al. | 257/437 |
| 2014/0311568 A1* | 10/2014 | Lin et al. | 136/259 |
| 2014/0311569 A1* | 10/2014 | Chen et al. | 136/259 |
| 2014/0319524 A1* | 10/2014 | Phillips et al. | 257/49 |
| 2015/0047700 A1* | 2/2015 | Miura et al. | 136/256 |

* cited by examiner

SOLAR CELL STRUCTURE AND METHOD FOR FABRICATING THE SAME

FIELD OF THE INVENTION

The present invention relates to a solar cell structure, particularly to a surface structure of a crystalline silicon solar cell.

BACKGROUND OF THE INVENTION

In monocrystalline silicon, atoms are periodically arranged according to a specified rule. In fabricating monocrystalline silicon, silicon metal having a purity of 99.999999999% (totally 11 digits of "9" used to express the purity) is fused in a quartz crucible. Next, a seed crystal is inserted into the liquid silicon, rotated at a speed of 2-20 rpm and slowly pulled up at a speed of 0.3-10 mm per minute to form a monocrystalline silicon ingot having a diameter of 4-8 inches. The abovementioned process is the so-called Czochralski method. The monocrystalline silicon-based solar cell has high efficiency and high reliability and has been widely used nowadays.

The fossil fuel power plants and nuclear power plants dominate power generation in Taiwan. Therefore, Taiwan relies on the imported coal and nuclear fuel very much. Recently, the price of petroleum is growing higher and higher. Further, the safety of nuclear power is worried by people because the nuclear power plants have been too old to operate safely in Taiwan. In order to reduce the dependence on imported coal and nuclear power generation, Taiwan pays much attention to renewable energies now.

Taiwan is a subtropical country having abundant sunshine. Further, Taiwan has mature semiconductor industry and plays a significant role in the global solar cell production. Therefore, Taiwan is very suitable to develop solar energy.

The current solar cell fabrication process includes the following steps: using the RCA process to clean the surface of the substrate; patterning the surface of the substrate; using an acidic solution to clean the patterned surface; using a diffusion process to fabricate a P-type or N-type semiconductor layer on the surface of the substrate; etching the edges of the substrate having experienced the abovementioned diffusion process; removing the oxide on the surface of the substrate; fabricating an antireflection layer on the surface of the substrate; and fabricating metal electrodes on the substrate. Whether a P-type or N-type semiconductor layer is fabricated in the abovementioned diffusion process depends on the conductivity type of the substrate. However, a P-type doped silicon substrate is normally used as the substrate, and a high-temperature diffusion process is used to fabricate an N-type doped semiconductor layer.

From the abovementioned description, it is leaned that a solar cell fabrication process includes many different fabrication processes. It is very important for solar cells to increase the efficiency and decrease fabrication cost in the fabrication process. It is particularly critical to enhance the antireflection performance. The antireflection function is usually achieved via etching the surface with an acidic solution or fabricating an antireflection layer on the surface, which needs many fabrication processes and increases the fabrication cost. Metal electrodes are fabricated after the antireflection layer is completed. However, the fabrication of the metal electrodes would decrease the performance of the antireflection layer, which should decrease light utilization and efficiency of the solar cell.

SUMMARY OF THE INVENTION

Considering the problems discussed above, the present invention fabricates a microsphere-roughened antireflection structure after the metal electrodes have been done to avoid degrading the antireflection function and promote the efficiency of the crystalline silicon solar cell.

The present invention proposes a solar cell structure comprising a P-type metal contact electrode; a P-type semiconductor layer; a P-type monocrystalline substrate; an N-type semiconductor layer; an N-type metal contact electrode; and a microsphere-roughened antireflection layer, wherein the N-type semiconductor layer and the P-type semiconductor layer are respectively arranged on an upper surface and a lower surface of the P-type monocrystalline substrate. The P-type metal contact electrode is disposed below the P-type semiconductor layer, and the N-type metal contact electrode has a specified pattern and is connected with the N-type semiconductor layer. The microsphere-roughened antireflection layer is arranged on an upper surface of the N-type semiconductor layer, which is not cover the N-type metal contact electrode.

In one embodiment, the solar cell structure of the present invention further comprises a surface passivation layer disposed on the upper surface of the N-type semiconductor layer. The N-type metal contact electrode passes through the surface passivation layer to connect with the N-type semiconductor layer. In fabrication, the surface passivation layer is fabricated on the upper surface of the N-type semiconductor layer beforehand; next, the N-type metal contact electrode having a specified pattern is fabricated on an upper surface of the surface passivation layer; next, a baking process is undertaken to let the N-type metal contact electrode pass through the surface passivation layer to connect with the N-type semiconductor layer; then, the microsphere-roughened antireflection layer is fabricated on the upper surface of the surface passivation layer without covering the N-type metal contact electrode.

Thus, the surface passivation layer can provide very good protection function, and the microsphere-roughened antireflection layer can reduce sunlight reflection and increase the transmittance of sunlight. In the present, the fabrication of the microsphere-roughened antireflection layer is undertaken in the last step to avoid degrading the performance of the microsphere-roughened antireflection layer and promote the efficiency of the solar cell.

DETAILED DESCRIPTION OF THE PREFERRED EMBODIMENTS

The technical contents of the present invention will be demonstrated in detail with embodiments. However, it should be understood: the embodiments are only to exemplify the present invention but not to limit the scope of the present invention.

Figure 1:
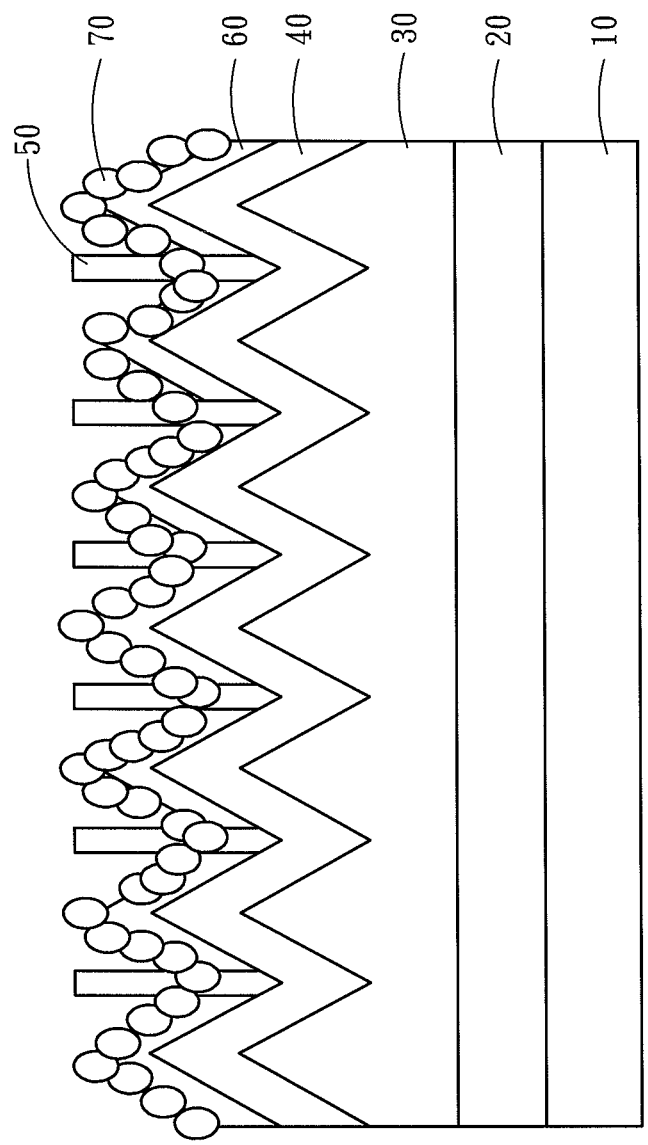
FIG. 1 is a diagram schematically showing a solar cell structure according to one embodiment of the present invention.

Refer to FIG. 1. The solar cell structure of the present invention comprises a P-type metal contact electrode 10; a P-type semiconductor layer 20; a P-type monocrystalline substrate 30; an N-type semiconductor layer 40; an N-type metal contact electrode 50; a surface passivation layer 60; and a microsphere-roughened antireflection layer 70. The N-type semiconductor layer 40 and the P-type semiconductor layer 20 are respectively arranged on the upper surface and the lower surface of the P-type monocrystalline substrate 30. The P-type metal contact electrode 10 is disposed below the P-type semiconductor layer 20. The surface passivation layer 60 is disposed on the upper surface of the N-type semiconductor layer 40. The N-type metal contact electrode 50 has a specified pattern and passes through the surface passivation layer 60 to connect with the N-type semiconductor layer 40. The microsphere-roughened antireflection layer 70 is arranged on a portion of the upper surface of the surface passivation layer 60 which is free of the N-type metal contact electrode 50. I.e., the microsphere-roughened antireflection layer 70 is arranged on the upper surface of the surface passivation layer 60 without covering the N-type metal contact electrode 50.

In one embodiment, the upper surface of the P-type monocrystalline substrate 30, which contacts the N-type semiconductor layer 40, is a serrated surface, so that the N-type semiconductor layer 40, the surface passivation layer 60 and the microsphere-roughened antireflection layer 70 that are formed thereon also have a serrated shape, and whereby is enhanced the antireflection effect and increased the efficiency of the solar cell structure.

In the fabrication of the solar cell structure of the present invention, provide a P-type monocrystalline substrate 30 firstly. Next, clean the P-type monocrystalline substrate 30 with acetone for 10 minutes. Next, clean the P-type monocrystalline substrate 30 with ethanol for 10 minutes. Next, clean the P-type monocrystalline substrate 30 with deionized water (DI water) for 10 minutes. Next, dry the P-type monocrystalline substrate 30 at a temperature of 100° C. for 10 minutes.

In the fabrication of the N-type semiconductor layer 40 on the P-type monocrystalline substrate 30, use a spin-coating machine to spin-coat a phosphorus diffusion solution on the P-type monocrystalline substrate 30 uniformly to let the P-type monocrystalline substrate 30 coated with phosphorus. The spin-coating machine is set to respectively rotate at two different stages. During the first stage, the spin-coating machine rotates at a speed of 1000 rpm for 15 seconds. During the second stage, the spin-coating machine rotates at a speed of 3000 rpm for 20 seconds.

Next, place the P-type monocrystalline substrate 30 in a high-temperature furnace tube filled with nitrogen, and bake the P-type monocrystalline substrate 30 at a temperature of 200° C. for 15 minutes to dry the organic materials of the phosphorus diffusion solution. Next, place the P-type monocrystalline substrate 30 in a fast-annealing furnace. Next, evacuate the fast-annealing furnace to a pressure of below 100 millitorr. Next, fill the fast-annealing furnace with nitrogen and maintain the pressure of nitrogen at 4-6 torr. Next, anneal the P-type monocrystalline substrate 30 at a temperature of 950° C. for about 60 seconds. Thus is completed the fabrication of the N-type semiconductor layer 40.

Before the N-type semiconductor layer 40 is fabricated on the P-type monocrystalline substrate 30, the upper surface of the P-type monocrystalline substrate 30, which is going to contact the N-type semiconductor layer 40, is etched to form a serrated surface. Thereby, the N-type semiconductor layer 40, the surface passivation layer 60 and the microsphere-roughened antireflection layer 70 also have serrated surfaces.

In the fabrication of the P-type semiconductor layer 20 on the P-type monocrystalline substrate 30, use a spin-coating machine to spin-coat a boron diffusion solution on the P-type monocrystalline substrate 30 uniformly to let the P-type monocrystalline substrate 30 coated with boron. The spin-coating machine is set to respectively rotate at two different stages. During the first stage, the spin-coating machine rotates at a speed of 2000 rpm for 10 seconds. During the second stage, the spin-coating machine rotates at a speed of 3000 rpm for 20 seconds. Next, place the P-type monocrystalline substrate 30 in a high-temperature furnace tube filled with nitrogen, and bake the P-type monocrystalline substrate 30 at a temperature of 200° C. for 15 minutes to dry the organic materials of the boron diffusion solution. Next, place the P-type monocrystalline substrate 30 in a fast-annealing furnace. Next, evacuate the fast-annealing furnace to a pressure of below 100 millitorr. Next, fill the fast-annealing furnace with nitrogen and maintain the pressure of nitrogen at 4-6 torr. Next, anneal the P-type monocrystalline substrate 30 at a temperature of 950° C. for about 60 seconds. Thus is completed the fabrication of the P-type semiconductor layer 20.

In the fabrication of the surface passivation layer 60, a sputtering system is used to deposit a hafnium dioxide ($HfO_2$) film, wherein the sputtering system is filled with 95% of argon and 5% of oxygen, and the pressure of a chamber of the sputtering system is controlled to 5 millitorr, and the radio frequency power for the sputtering system is controlled to 100-300 W for 4 minutes, whereby is obtained a surface passivation layer 60 having a thickness of about 80 nm.

Figure 2A:
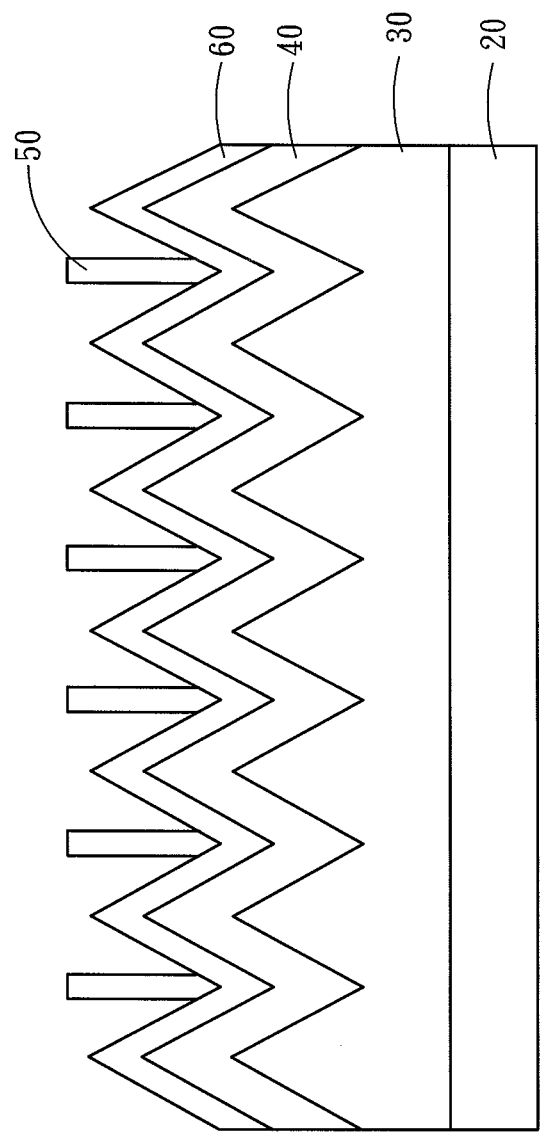
FIG. 2A is a diagram schematically showing a semi-finished product of a solar cell structure according to one embodiment of the present invention.
Figure 2B:
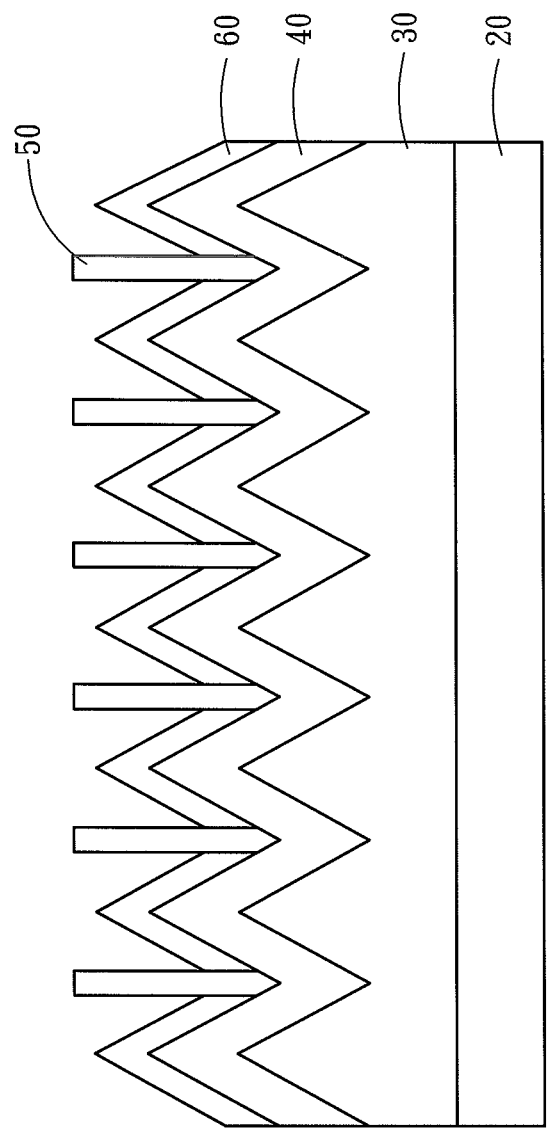
FIG. 2B is a diagram schematically showing another semi-finished product of a solar cell structure according to one embodiment of the present invention.

Refer to FIG. 2A and FIG. 2B. In the fabrication of the N-type metal contact electrode 50, a thermal evaporation system is used to deposit aluminum having a thickness of about 150 nm on the upper surface of the surface passivation layer 60 to function as the N-type metal contact electrode 50, as shown in FIG. 2A. After the deposition of the N-type metal contact electrode 50, a baking process is undertaken to let the N-type metal contact electrode 50 diffuse through the surface passivation layer 60 to connect with the N-type semiconductor layer 40, as shown in FIG. 2B.

Similarly, in the fabrication of the P-type metal contact electrode 10, a thermal evaporation system is used to deposit aluminum having a thickness of about 300 nm on the lower surface of the P-type semiconductor layer 20 to function as the P-type metal contact electrode 10.

In the fabrication of the microsphere-roughened antireflection layer 70, a spin-coating machine is used to spin-coat a solution of silicon dioxide ($SiO_2$) particles which is a material of the microsphere-roughened antireflection layer 70 on the upper surface of the surface passivation layer 60 contacting the N-type metal contact electrode 50. The spin-coating machine is set to respectively rotate at two different stages. During the first stage, the spin-coating machine rotates at a speed of 1000 rpm for 10 seconds. During the second stage, the spin-coating machine rotates at a speed of 1000-5000 rpm for 20-40 seconds. Then, the structure coated with the $SiO_2$ particles is placed in a high-temperature annealing furnace at a temperature of 300° C. for 10 minutes to enhance the cohesion of the crystalline structures inside the silicon dioxide particles.

In conclusion, the present invention is characterized in fabricating a surface passivation layer and a microsphere-roughened antireflection layer in a solar cell to respectively provide a protection effect and increase transmittance of sunlight. In the present invention, the microsphere-roughened antireflection layer is fabricated after the P-type metal contact electrode and the N-type metal contact electrode have been done. Therefore, the present invention is superior in the antireflection function and able to promote the efficiency of solar cells.

What is claimed is:

1. A method for fabricating a solar cell structure with a microsphere-roughened antireflection structure, the solar cell structure with the microsphere-roughened antireflection structure comprising:
   a P-type monocrystalline substrate;
   a N-type semiconductor layer and a P-type semiconductor that are respectively arranged on an upper surface and a lower surface of the P-type monocrystalline substrate;
   a P-type metal contact electrode arranged below the P-type semiconductor layer;
   a N-type metal contact electrode having a specified pattern and connected with the N-type semiconductor layer;
   a microsphere-roughened antireflection layer arranged on an upper surface of the N-type semiconductor layer without covering the N-type metal contact electrode; and
   a surface passivation layer arranged on the upper surface of the N-type semiconductor layer, wherein the N-type metal contact electrode passes through the surface passivation layer to connect with the N-type semiconductor layer,
   wherein the surface passivation layer is fabricated on the upper surface of the N-type semiconductor layer beforehand; next, the N-type metal contact electrode having the specified pattern is fabricated on an upper surface of the surface passivation layer; next, a baking process is undertaken to make the N-type metal contact electrode pass through the surface passivation layer to connect with the N-type semiconductor layer; next, the microsphere-roughened antireflection layer is fabricated on the upper surface of the surface passivation layer, without covering the N-type metal contact electrode.

2. The method for fabricating a solar cell structure with a microsphere-roughened antireflection structure according to claim 1, wherein fabricating the N-type semiconductor layer on the P-type monocrystalline substrate includes the following steps of: using a spin-coating machine to spin-coat a phosphorus diffusion solution on the P-type monocrystalline substrate uniformly, wherein the spin-coating machine is set to respectively rotate at two different stages; during the first stage, the spin-coating machine rotates at a speed of 1000 rpm for 15 seconds; during the second stage, the spin-coating machine rotates at a speed of 3000 rpm for 20 seconds; placing the P-type monocrystalline substrate in a high-temperature furnace tube filled with nitrogen to be baked at a temperature of 200° C. for 15 minutes to dry organic materials of the phosphorus diffusion solution; placing the P-type monocrystalline substrate in a fast-annealing furnace; evacuating the fast-annealing furnace to a pressure of below 100 millitorr; filling the fast-annealing furnace with nitrogen which is maintained at a pressure of 4-6 torr; and annealing the P-type monocrystalline substrate at a temperature of 950° C. for about 60 seconds to complete fabrication of the N-type semiconductor layer.

3. The method for fabricating a solar cell structure with a microsphere-roughened antireflection structure according to claim 1, wherein before the N-type semiconductor layer is fabricated on the P-type monocrystalline substrate, a surface of the P-type monocrystalline substrate for the N-type semiconductor layer to be fabricated thereon is etched to become a serrated surface.

4. The method for fabricating a solar cell structure with a microsphere-roughened antireflection structure according to claim 1, wherein fabricating the P-type semiconductor layer on the P-type monocrystalline substrate includes the following steps of: using a spin-coating machine to spin-coat a boron diffusion solution on the P-type monocrystalline substrate uniformly, wherein the spin-coating machine is set to respectively rotate at two different stages; during the first stage, the spin-coating machine rotates at a speed of 2000 rpm for 10 seconds; during the second stage, the spin-coating machine rotates at a speed of 3000 rpm for 20 seconds; placing the P-type monocrystalline substrate in a high-temperature furnace tube filled with nitrogen to be baked at a temperature of 200° C. for 15 minutes to dry organic materials of the boron diffusion solution; placing the P-type monocrystalline substrate in a fast-annealing furnace; evacuating the fast-annealing furnace to a pressure of below 100 millitorr; filling the fast-annealing furnace with nitrogen which is maintained at a pressure of 4-6 torr; annealing the P-type monocrystalline substrate at a temperature of 950° C. for about 60 seconds to complete fabrication of the P-type semiconductor layer.

5. The method for fabricating a solar cell structure with a microsphere-roughened antireflection structure according to claim 1, wherein the surface passivation layer is fabricated by using a sputtering system to deposit a hafnium dioxide ($HfO_2$) film, and wherein the sputtering system is filled with 95% of argon and 5% of oxygen that are controlled at a pressure of 5 millitorr; a radio frequency power for the sputtering system is controlled to 100-300 W for 4 minutes to obtain the surface passivation layer having a thickness of about 80 nm.

6. The method for fabricating a solar cell structure with a microsphere-roughened antireflection structure according to claim 1, wherein the N-type metal contact electrode is fabricated by using a thermal evaporation system to deposit aluminum having a thickness of about 150 nm on the upper surface of the surface passivation layer, whereafter a baking process is undertaken to make the N-type metal contact electrode diffuse through the surface passivation layer to connect with the N-type semiconductor layer.

7. The method for fabricating a solar cell structure with a microsphere-roughened antireflection structure according to claim 1, wherein fabricating the microsphere-roughened antireflection layer includes the following steps: using a spin-coating machine to spin-coat a solution of silicon dioxide ($SiO_2$) particles on the upper surface of the surface passivation layer, wherein the spin-coating machine is set to respectively rotate at two different stages; during the first stage, the spin-coating machine rotates at a speed of 1000 rpm for 10 seconds; during the second stage, the spin-coating machine rotates at a speed of 1000-5000 rpm for 20-40 seconds; placing the coated structure in a high-temperature annealing furnace to be processed at a temperature of 300° C. for 10 minutes to enhance cohesion of crystalline structures inside the silicon dioxide particles.

* * * * *